United States Patent
Ha et al.

(10) Patent No.: US 9,029,964 B2
(45) Date of Patent: May 12, 2015

(54) SEMICONDUCTOR DEVICE AND METHOD FOR FABRICATING THE SAME

(75) Inventors: Ga Young Ha, Icheon-si (KR); Ki Seon Park, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 241 days.

(21) Appl. No.: 13/479,670

(22) Filed: May 24, 2012

(65) Prior Publication Data
US 2013/0075841 A1    Mar. 28, 2013

(30) Foreign Application Priority Data
Sep. 28, 2011  (KR) .................. 10-2011-0098170

(51) Int. Cl.
| | | |
|---|---|---|
| H01L 29/82 | (2006.01) |
| H01L 43/08 | (2006.01) |
| H01L 43/12 | (2006.01) |
| H01F 41/30 | (2006.01) |
| B82Y 40/00 | (2011.01) |

(52) U.S. Cl.
CPC .............. *H01L 43/08* (2013.01); *H01L 43/12* (2013.01); *H01F 41/307* (2013.01); *B82Y 40/00* (2013.01)

(58) Field of Classification Search
USPC .......... 257/E43.006, 421, E29.323, E21.001; 438/3
See application file for complete search history.

(56) References Cited

U.S. PATENT DOCUMENTS

| | | | |
|---|---|---|---|
| 6,759,263 B2* | 7/2004 | Ying et al. .................. 438/48 |
| 7,602,032 B2* | 10/2009 | Klostermann et al. ........ 257/421 |
| 7,919,826 B2* | 4/2011 | Iwayama et al. .............. 257/421 |
| 8,334,148 B2* | 12/2012 | Jeong et al. ....................... 438/3 |
| 2003/0184919 A1* | 10/2003 | Lin et al. ....................... 360/314 |
| 2004/0026369 A1* | 2/2004 | Ying et al. ....................... 216/63 |
| 2004/0043620 A1* | 3/2004 | Ying et al. ..................... 438/710 |
| 2004/0180531 A1* | 9/2004 | Horikoshi ..................... 438/622 |
| 2006/0014305 A1* | 1/2006 | Lee et al. .......................... 438/3 |
| 2007/0020934 A1* | 1/2007 | Gaidis et al. .................. 438/689 |
| 2008/0089118 A1* | 4/2008 | Kajiyama ...................... 365/158 |
| 2008/0164548 A1* | 7/2008 | Ranjan et al. ................ 257/421 |
| 2008/0194090 A1* | 8/2008 | Cho et al. ...................... 438/589 |
| 2009/0065883 A1* | 3/2009 | Wang et al. ................... 257/421 |
| 2009/0074611 A1* | 3/2009 | Monzyk et al. ................ 422/29 |
| 2009/0078927 A1* | 3/2009 | Xiao et al. ....................... 257/9 |
| 2009/0091863 A1* | 4/2009 | Hosotani et al. ........... 360/324.2 |
| 2009/0130779 A1* | 5/2009 | Li et al. ............................ 438/3 |
| 2009/0206427 A1* | 8/2009 | Oh et al. ....................... 257/421 |
| 2009/0256220 A1* | 10/2009 | Horng et al. ................. 257/421 |

(Continued)

FOREIGN PATENT DOCUMENTS

| | | |
|---|---|---|
| KR | 1020100053856 | 5/2010 |
| KR | 1020100076556 | 7/2010 |

(Continued)

*Primary Examiner* — Alexander Sofocleous
*Assistant Examiner* — Ankush Singal
(74) *Attorney, Agent, or Firm* — IP & T Group LLP

(57) ABSTRACT

A method for manufacturing a semiconductor device includes forming plural layers of a MTJ device, depositing a conductive layer over the plural layers, forming a hard mask pattern used for patterning the plural layers over the conductive layer, where the conductive layer is exposed through the hard mask pattern, performing hydrogen peroxide process to volatilize the exposed conductive layer and removing the volatilized conductive layer, and patterning the plural layers by using the hard mask pattern as an etch mask to form the MTJ device.

12 Claims, 4 Drawing Sheets

(56) References Cited

U.S. PATENT DOCUMENTS

| | | | |
|---|---|---|---|
| 2010/0022030 A1* | 1/2010 | Ditizio | 438/3 |
| 2010/0240151 A1* | 9/2010 | Belen et al. | 438/3 |
| 2010/0301436 A1* | 12/2010 | Sashida | 257/421 |
| 2010/0327248 A1* | 12/2010 | Khoueir et al. | 257/2 |
| 2011/0059557 A1* | 3/2011 | Yamagishi et al. | 438/3 |
| 2011/0316104 A1* | 12/2011 | Inokuchi et al. | 257/421 |
| 2012/0028373 A1* | 2/2012 | Belen et al. | 438/3 |
| 2012/0038011 A1* | 2/2012 | Iba | 257/421 |
| 2012/0094433 A1* | 4/2012 | Mizoguchi et al. | 438/104 |
| 2012/0122247 A1* | 5/2012 | Mather et al. | 438/3 |
| 2012/0236631 A1* | 9/2012 | Park et al. | 365/158 |
| 2012/0280339 A1* | 11/2012 | Zhang et al. | 257/421 |
| 2013/0001652 A1* | 1/2013 | Yoshikawa et al. | 257/252 |
| 2013/0034917 A1* | 2/2013 | Lee | 438/3 |
| 2013/0042081 A1* | 2/2013 | Park et al. | 711/154 |

FOREIGN PATENT DOCUMENTS

| | | |
|---|---|---|
| KR | 1020100076557 | 7/2010 |
| KR | 1020110002706 | 1/2011 |

* cited by examiner

SEMICONDUCTOR DEVICE AND METHOD FOR FABRICATING THE SAME

CROSS-REFERENCE(S) TO RELATED APPLICATIONS

The present application claims priority of Korean Patent Application No. 10-2011-0098170, filed on Sep. 28, 2011, which is incorporated herein by reference in its entirety.

BACKGROUND OF THE INVENTION

The present invention relates to a semiconductor device, and more particularly to a semiconductor device including a magnetic tunnel junction (MTJ) device.

A dynamic random access memory (DRAM), which is one of the widely used semiconductor memory devices, has features of high operation speed and high integration. However, the DRAM is a volatile memory device which loses data, when a power is off, and performs a refresh process to prevent loss of stored data, even when the power is on. Meanwhile, a flash memory is a non-volatile memory device and may be manufactured in high integration, while having a relatively low operation speed. As compared with the DRAM and the flash memory, a magneto-resistance random memory device (MRAM) has features of non-volatility, high operation speed, and high integration (scalability).

The MRAM is a non-volatile memory device where data is stored by magnetic storage elements having a different resistance depending on magnetic field changed between ferromagnetic plates. The magnetic storage element is a component including two ferromagnetic plates separated by an insulating layer. If polarities of the two ferromagnetic plates are parallel (the same), resistance of magnetic storage element is minimized. On the other hand, if polarities of the two ferromagnetic plates are opposite, the resistance is maximized. The MRAM device stores data based on cell's resistance changed depending on magnetization of ferromagnetic plates in the magnetic storage element. As a magnetic storage element, a Magnetic Tunnel Junction (MTJ) is widely used.

In the MRAM, the MTJ generally includes a stacked structure of a ferromagnetic layer, an insulating layer, and another ferromagnetic layer. When electrons pass through an insulating layer serving as a tunneling barrier from a first ferromagnetic layer, the degree of tunneling the insulating layer by the electrons is determined by magnetic direction of second ferromagnetic layer. If two ferromagnetic layers have the same polarity (parallel magnetic direction), amount of current tunneling the insulating layer is maximized. On the other hand, if two ferromagnetic layers have opposite magnetic direction, amount of current is minimized. For example, when resistance based on the tunneling current is high, information stored in the MTJ may be recognized as a logic level "1" (or "0"). If the resistance is low, information may be recognized as a logic level "0" (or "1"). Here, one of two ferromagnetic layers is called a pinned layer because its polarity is set to particular value, but the other is called a free layer because its polarity may be changed depending on magnetic field or supplied current.

However, there are some limits in manufacturing the MTJ device. First, it is not easy to make stacked patterns of a ferromagnetic layer, an insulating layer, and another ferromagnetic layer. Also, if sides of stacked patterns are exposed after patterning process, by-products are likely to adhere to the exposed surface of stacked patterns to cause a short circuit.

SUMMARY OF THE INVENTION

An embodiment of the present invention is directed to a method for manufacturing a semiconductor device to increase process reliability of making a Magnetic Tunnel Junction (MTJ) device.

In accordance with an embodiment of the present invention, a method for manufacturing a semiconductor device includes forming plural layers of a magnetic tunnel junction (MTJ) device, depositing a conductive layer over the plural layers, forming a hard mask pattern used for patterning the plural layers over the conductive layer, wherein the conductive layer is exposed through the hard mask pattern, performing hydrogen peroxide process to volatilize the exposed conductive layer and removing the volatilized conductive layer, and patterning the plural layers by using the hard mask pattern as an etch mask to form the MTJ device.

In accordance with another embodiment of the present invention, a method for manufacturing a semiconductor device includes: forming a pinned layer, a tunnel insulating layer, a conductive layer, and a free layer to form a magnetic tunnel junction (MTJ) device; forming a hard mask pattern over the free layer; patterning the free layer by using the hard mask pattern as an etch mask to form a free layer pattern and expose the conductive layer through the free layer pattern; performing hydrogen peroxide process to volatilize the exposed conductive layer and removing the volatilized conductive layer; and patterning the pinned layer and the tunnel insulating layer by using the hard mask pattern as an etch mask to form the MTJ device.

In accordance with another embodiment of the present invention, a semiconductor device includes a magnetic tunnel junction (MTJ) device, a conductive pattern arranged over the MTJ device, a metal layer pattern arranged over the conductive pattern, and a metal nitride layer arranged on side surfaces of the metal layer pattern.

DESCRIPTION OF SPECIFIC EMBODIMENTS

Figure 1A:
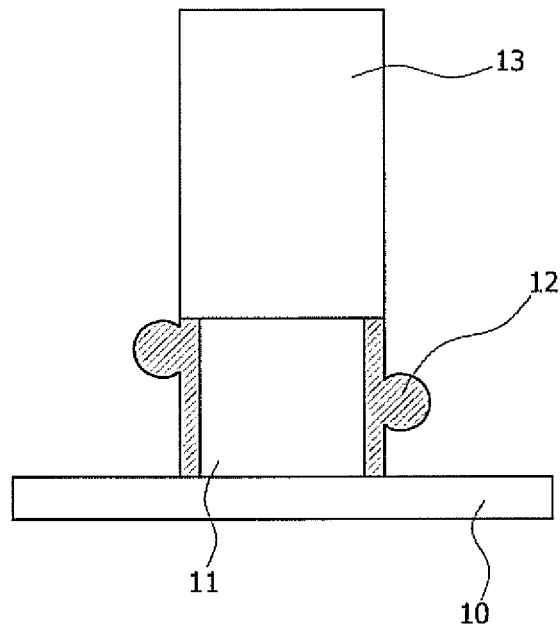
FIGS. 1A and 1B are cross-sectional diagrams showing a method for manufacturing a semiconductor device.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In a method for manufacturing a Magnetic Tunnel Junction (MTJ) device included in a magneto-resistance random memory device (MRAM), a conductive by-product, which is not readily volatile substance, may be generated by a metallic compound used for the MTJ device, during an etching process. If the conductive by-product adheres to side surfaces of the MTJ device, operation characteristics of the MTJ device deteriorates. In an embodiment of the present invention, an effective etching process for removing the conductive by-product is provided.

Figure 1B:
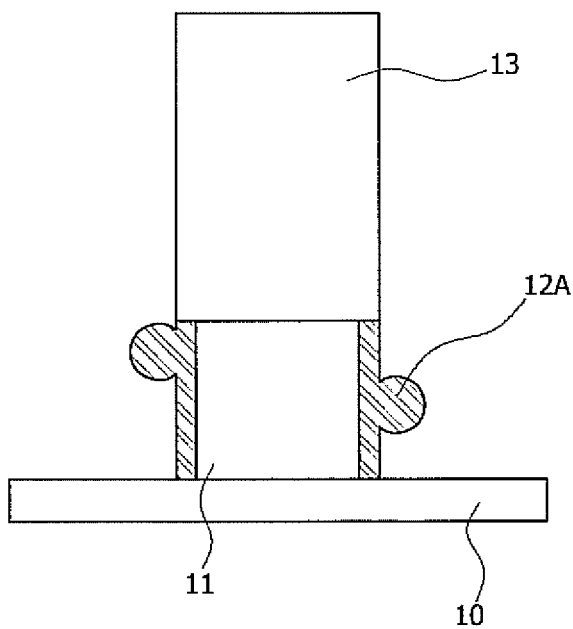

FIGS. 1A and 1B are cross-sectional diagrams showing a method for manufacturing a semiconductor device.

A typical method for manufacturing a MD device includes laminating plural layers used for the MTJ device and performing an etching process to make patterns. Since the plural layer for the MD device includes metallic materials, conductive by-products are generated during the etching process. A pinning layer, a pined layer, and a free layer constituting the MTJ device include a metallic compound. Because the metallic compound has a relatively high boiling point, the by-products generated from the metallic compound may not be volatilized during follow-up processes after the etching process. They may adhere to side surfaces of the MTJ device. If the conductive by-products stick to side surfaces of the MD device, electronic characteristics of the MTJ device become deteriorated.

The conductive by-products may cause short-circuits between the pinned layer and the free layer. Accordingly, electronic characteristics of the MD device degenerate. As a result, operation reliability and manufacture yield of semiconductor device including the MTJ device degenerate. To reduce the amount of the conductive by-products, some of the chemicals used in the etching process may be changed to oxidize by-products. The conductive by-products may lose their electrical conductivity by being oxidized. However, in a case of ruthenium (Ru), oxidized ruthenium ($RuO_2$) still has electrical conductivity. Accordingly, the oxidization may not completely prevent the patterns of MTJ device from short-circuiting.

Referring to FIG. 1A, there is an underlying layer 10 for providing a MTJ device thereon. Over the underlying layer 10, there are a patterned ruthenium layer 11 and a patterned tungsten layer 13. By-products 12, generated when the ruthenium layer 11 and tungsten layer 13 are patterned, adhere to a side surface of the ruthenium layer 11.

If the oxidization process is performed, referring to FIG. 1B, the side surface of the ruthenium layer 11 and the by-products 12 are oxidized to generate a ruthenium oxide layer 11 and an oxidized ruthenium piece 12A. As above described, because the oxidized ruthenium piece 12A does not lose its conductivity, the oxidized ruthenium piece 12A adhering to side surface of the MTJ device may generate short-circuiting.

FIGS. 2A to 2E are cross-sectional diagrams showing a method for manufacturing a semiconductor device in accordance to an embodiment of the present invention.

Figure 2A:
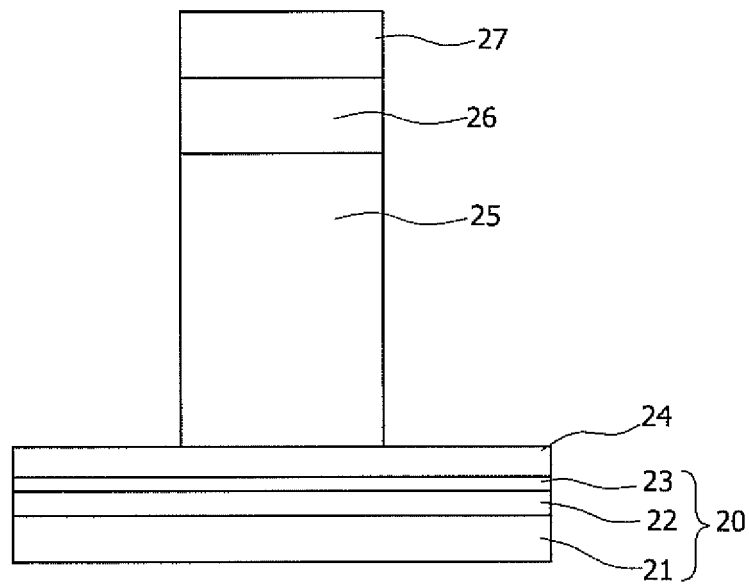
FIGS. 2A to 2E are cross-sectional diagrams showing a method for manufacturing a semiconductor device in accordance to an embodiment of the present invention.

Referring to FIG. 2A, plural layers 20 are formed for providing a MTJ. On the plural layers 20, a ruthenium layer 24 is deposited. The ruthenium layer 24, connected to the MTJ device, serves as an electrode.

The plural layers 20 for providing the MTJ includes a pinned layer 21, a tunnel insulating layer 22, and a free layer 23. In the plural layers 20, various-type layers may be laminated. The pinned layer 21 has a polarity (i.e., magnetic direction) set to a specific value. The free layer 23 has a magnetic direction changed depending on the amount of supplied current corresponding to data. The pinned layer 21 may include a pinning plate and a pinned plate. In the embodiment, the MTJ may include electrodes.

The pinning plate, used for setting a polarity of the pinned plate to a specific value, includes an antiferromagnetic material. For example, the antiferromagnetic material includes at least one of materials marked by chemical formulae of IrMn, PtMn, MnO, MnS, MnTe, $MnF_2$, $FeF_2$, $FeCl_2$, FeO, $CoCl_2$, CoO, $NiCl_2$, and NiO. The pinning plate may be formed in the shape of either a single layer including one of the antiferromagnetic materials or laminated layer of some antiferromagnetic materials.

The pinned plate, having fixed polarity set by the pinning plate, and the free layer 23 includes a ferromagnetic material. For example, the ferromagnetic material includes at least one of materials marked by chemical formulae of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. Here, the pinned plate and the free layer 23 may be formed in the shape of either a single layer including one of the antiferromagnetic materials or laminated layer of some antiferromagnetic materials The pinned plate and the free layer 23 may include a laminated layer of ruthenium and one of the ferromagnetic materials, e.g., laminated layer of CdFe, Ru and CoFe. Further, the pinned plate and the free layer 23 may include a synthetic anti-ferromagnetic (SAF) layer having a sequentially laminated structure of a ferromagnetic layer, an anti-ferromagnetic coupling spacer layer, and a ferromagnetic layer. The tunnel insulating layer 22 is used as a tunneling barrier between the pinned layer 21 and the free layer 23. The tunnel insulating layer 22 may include any material having insulation properties. For example, the tunnel insulating layer may include a magnesium oxide layer (MgO).

Over the ruthenium layer 24, a tungsten (W) layer 25, a tantalum (Ta) layer 26, and an undoped silicate glass (USG) layer 27 are formed. Here, the tungsten layer 25 and the tantalum layer 26 may be substituted by other metal layers. The USG layer 27 may be substituted by a silicon oxide material layer such as a boro-silicate glass (BSG) layer, a phopho-silicate glass (PSG) layer, a boro-phospho-silicate glass (BPSG) layer, a tetra-ethly-ortho-silicate glass (TEOS) layer, a high density plasma-CVD (HDPCVD) layer, and the like.

The ruthenium layer 24 serves as a capping layer for preventing the plural layers 20 for the MTJ device from being damaged during processes of forming the tungsten layer 25, the tantalum layer 26, and the USG layer 27.

Figure 2B:
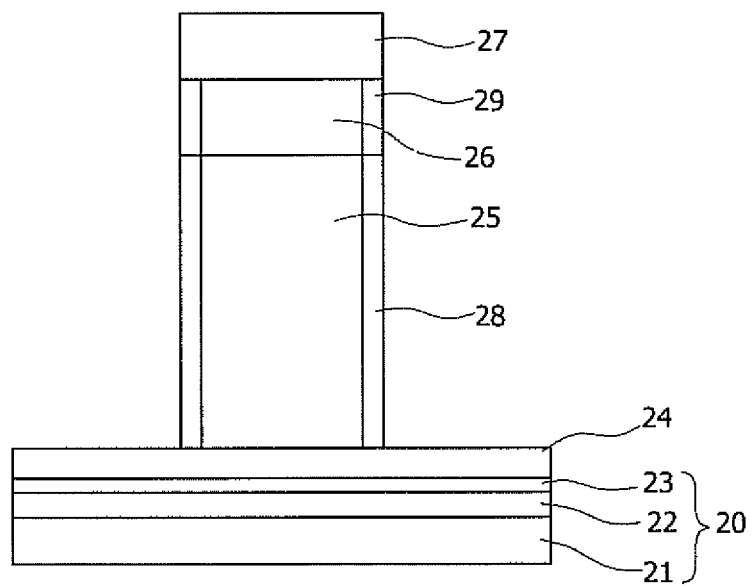

Referring to FIG. 2B, a plasma treatment in an ambient $N_2$ is performed to form a tungsten nitride layer 28 and a tantalum nitride layer 29. This plasma treatment is for preventing the tungsten layer 25, the tantalum layer 26, and the USG layer 27 from being oxidized during a following hydrogen peroxide process.

Figure 2C:
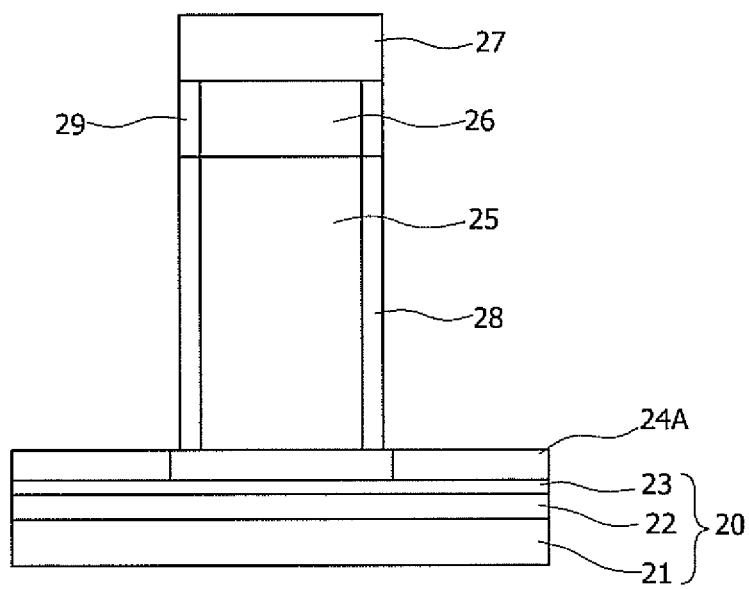

Referring to FIG. 2C, as the hydrogen peroxide process, a plasma treatment in an ambient gas of $O_2$, $O_3$ and combination thereof is performed. After the hydrogen peroxide process, the ruthenium layer 24 is changed into a layer including one of $RuO_3$, $RuO_4$ and combination thereof. This hydrogen peroxide process has no effect on some portion of ruthenium layer 24 under the tungsten layer 25.

Figure 2D:
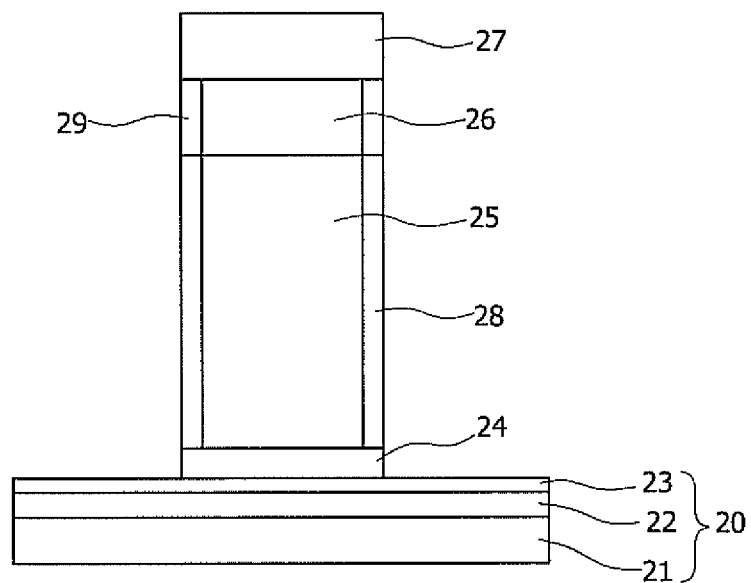

Referring to FIG. 2D, the partial portion of ruthenium layer 24, which is changed into an $RuO_3$ or $RuO_4$ layer, is removed.

Figure 2E:
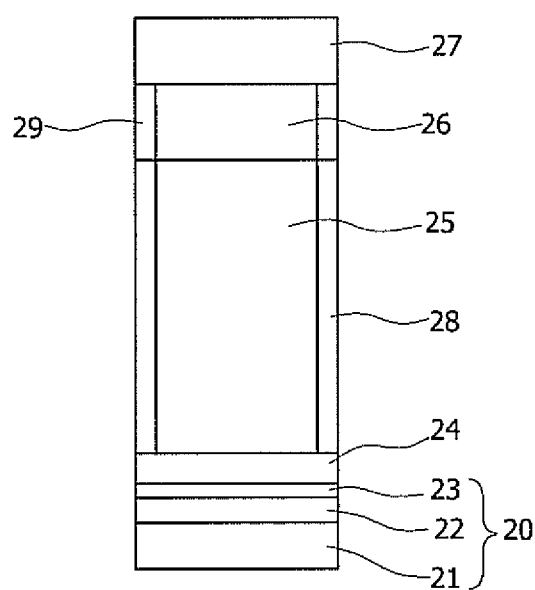

Referring to FIG. 2E, using the patterned tungsten layer 25, the patterned tantalum layer 26, the patterned USG layer 27, and the patterned ruthenium layer 24 as an etch mask, the plural layers 20 are etched to generate the MTJ device.

In a case that the ruthenium layer 24 is formed and patterned with the plural layers 20 for providing the MTJ device, some conductive by-products, such as Ru, $RuO_2$ and etc., which are not removed after the patterning process, may cause the free layer 23 and the pinned layer 21 to be short-circuited. In order that the MTJ device properly operates, the free layer 23 and the pinned layer 21 are to be electrically isolated.

In a manufacturing method according to an embodiment of the present invention, the hydrogen peroxide process is performed to change the ruthenium layer 24, which is to be patterned, into an $RuO_3$ or $RuO_4$ layer and then to volatilize the $RuO_3$ or $RuO_4$ layer. Here, $RuO_3$ and $RuO_4$ have properties of volatility. As the hydrogen peroxide process, there are used two ways: a thermal process performed at high temperature of about 350 to 1000° C. in ambient $O_2$; and a plasma treatment performed at about 350 to 500° C. in an ambient gas of $O_2$, $O_3$ and combination thereof.

In the embodiment, when a ruthenium layer is used as a capping layer of the MTJ device, the ruthenium layer is volatilized by using the hydrogen peroxide process which may change non-volatility characteristic of the ruthenium layer. Meanwhile, if the ruthenium layer is included inside a MTJ device, the ruthenium layer may be used for setting a magnetic moment of the MTJ device by exchanging bias with the neighboring layer. In this case, the hydrogen peroxide process may be used for patterning the ruthenium layer.

In detail, a pinned layer, a tunnel insulating layer, a conductive layer, and a free layer are formed in order to provide a MTJ device including a pinned layer pattern, a tunnel insulating layer pattern, a conductive layer pattern, and a free layer pattern. After a hard mask pattern is formed over the free layer, the free layer is patterned, i.e., etched, by using the hard mask pattern as an etch mask. After the hydrogen peroxide process is performed to change the conductive layer, which is not covered by the hard mask pattern, to have volatility, the conductive layer is volatilized. Then, using the hard mask pattern as an etch mask, the tunnel insulating layer and the pinned layer are patterned to generate the MTJ device.

When a ruthenium layer is included in plural layers for providing a MTJ device, if all layers formed over the ruthenium layer are etched and the hydrogen peroxide process is performed to change the exposed portion of ruthenium layer, the ruthenium layer may be readily patterned without generating any conductive by-products because the exposed portion of the ruthenium layer may be volatilized. This method may be applied to a MTJ device using any material which may get volatility from the hydrogen peroxide process as well. As the hydrogen peroxide process, above described two ways may be applicable.

As above described, in an embodiment of the present invention, conductive by-products may be prevented from adhering side surfaces of the Magnetic Tunnel Junction (MTJ) device. Accordingly, operation reliability of MTJ device may be increased.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a semiconductor device, comprising:
    forming plural layers of a magnetic tunnel junction (MTJ) device;
    depositing a conductive layer over the plural layers;
    forming a hard mask pattern used for patterning the plural layers over the conductive layer, wherein the conductive layer is exposed through the hard mask pattern;
    performing hydrogen peroxide process to volatilize the exposed conductive layer and removing the volatilized conductive layer; and
    patterning the plural layers by using the hard mask pattern as an etch mask to form the MTJ device.

2. The method as recited in claim 1, wherein the hard mask pattern includes a metal layer and an insulating layer.

3. The method as recited in claim 2, further comprising nitrifying the metal layer to form a metallic nitride layer.

4. The method as recited in claim 3, wherein the exposed conductive layer changes from ruthenium (Ru) to one of $RuO_3$, $RuO_4$ and combination thereof after the performing of the hydrogen peroxide process.

5. The method as recited in claim 3, wherein the metal layer includes a tungsten layer and a tantalum layer.

6. The method as recited in claim 1, wherein the performing of the hydrogen peroxide process includes:
    performing a thermal process at about 350 to 1000° C. in ambient $O_2$; or
    performing a plasma treatment in an ambient gas of $O_2$, $O_3$ and combination thereof.

7. A method for manufacturing a semiconductor device, comprising:
    forming a pinned layer, a tunnel insulating layer, a conductive layer, and a free layer to form a magnetic tunnel junction (MTJ) device;
    forming a hard mask pattern over the free layer;
    patterning the free layer by using the hard mask pattern as an etch mask to form a free layer pattern and expose the conductive layer through the free layer pattern;
    performing hydrogen peroxide process to volatilize the exposed conductive layer and removing the volatilized conductive layer; and
    patterning the pinned layer and the tunnel insulating layer by using the hard mask pattern as an etch mask to form the MTJ device.

8. The method as recited in claim 7, wherein the hard mask pattern includes a metal layer and an insulating layer.

9. The method as recited in claim 8, further comprising nitrifying the metal layer to form a metallic nitride layer.

10. The method as recited in claim 7, wherein the conductive layer changes from ruthenium (Ru) to one of $RuO_3$, $RuO_4$ and combination thereof after the performing of the hydrogen peroxide process.

11. The method as recited in claim 9, wherein the metal layer includes a tungsten layer and a tantalum layer.

12. The method as recited in claim 7, wherein the performing of the hydrogen peroxide process includes:
    performing a thermal process at about 350 to 1000° C. in ambient $O_2$; or
    performing a plasma treatment in an ambient gas of $O_2$, $O_3$ and combination thereof.

* * * * *